United States Patent
Koumoto et al.

(10) Patent No.: US 8,304,335 B2
(45) Date of Patent: Nov. 6, 2012

(54) ELECTRODE STRUCTURE, SEMICONDUCTOR ELEMENT, AND METHODS OF MANUFACTURING THE SAME

(75) Inventors: Shigeru Koumoto, Tokyo (JP); Tatsuya Sasaki, Tokyo (JP); Kazuhiro Shiba, Tokyo (JP); Masayoshi Sumino, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/269,153

(22) Filed: Oct. 7, 2011

(65) Prior Publication Data

US 2012/0028456 A1    Feb. 2, 2012

Related U.S. Application Data

(62) Division of application No. 12/519,698, filed as application No. PCT/JP2007/001381 on Dec. 11, 2007, now Pat. No. 8,169,078.

(30) Foreign Application Priority Data

Dec. 28, 2006   (JP) .................................. 2006-354091

(51) Int. Cl.
    H01L 21/28    (2006.01)
(52) U.S. Cl. ................. 438/608; 438/656; 257/E21.158
(58) Field of Classification Search .................. 438/608, 438/656; 257/E21.158, 751, 103
    See application file for complete search history.

(56) References Cited

U.S. PATENT DOCUMENTS

| | | | | |
|---|---|---|---|---|
| 5,950,070 A | * | 9/1999 | Razon et al. | 438/113 |
| 6,429,530 B1 | * | 8/2002 | Chen | 257/778 |
| 6,656,765 B1 | * | 12/2003 | DiCaprio | 438/106 |
| 7,952,116 B2 | | 5/2011 | Kamei | |
| 2009/0179220 A1 | | 7/2009 | Fukunaga et al. | |
| 2009/0224282 A1 | | 9/2009 | Kamei | |

FOREIGN PATENT DOCUMENTS

| | | |
|---|---|---|
| JP | 1997-008407 A | 1/1997 |
| JP | 2000-174341 A | 6/2000 |
| JP | 3239350 B | 10/2001 |
| JP | 2005-340860 A | 12/2005 |
| JP | 2006-135311 A | 5/2006 |

OTHER PUBLICATIONS

Japanese Office Action mailed Mar. 27, 2012 for corresponding Japanese Patent Application No. 2008-552017.
International Search Report for PCT/JP2007/001381 mailed Mar. 4, 2008.

* cited by examiner

*Primary Examiner* — Roy Potter
(74) *Attorney, Agent, or Firm* — Sughrue Mion, PLLC

(57) ABSTRACT

According to the present invention, there is provided an electrode structure which includes: a nitride semiconductor layer; an electrode provided over the nitride semiconductor layer; and an electrode protective film provided over the electrode, wherein the nitride semiconductor layer contains a metal nitride containing Nb, Hf or Zr as a constitutive element, the electrode has a portion having a metal oxide containing Ti or V as a constitutive element formed therein, and the electrode protective film covers at least a portion of the electrode, and contains a protective layer having Au or Pt as a constitutive element.

5 Claims, 13 Drawing Sheets

FIG. 3
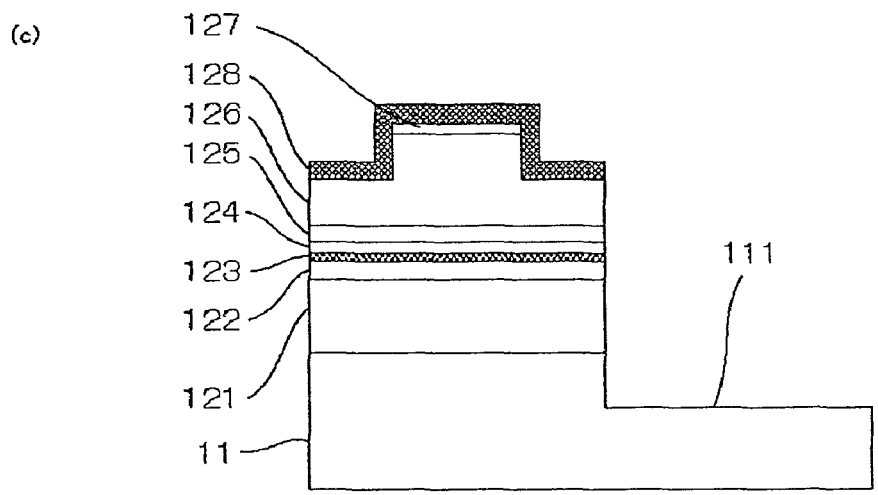
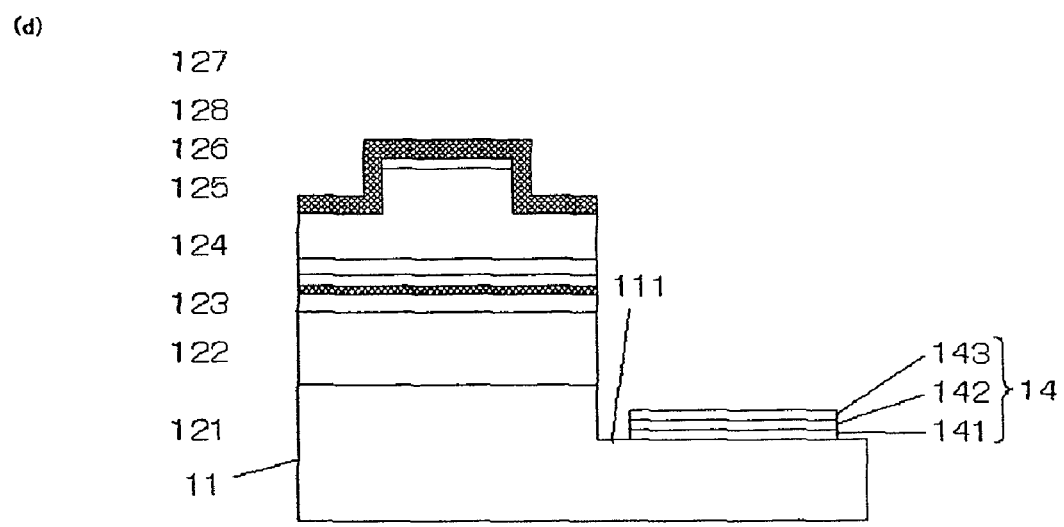

FIG. 4
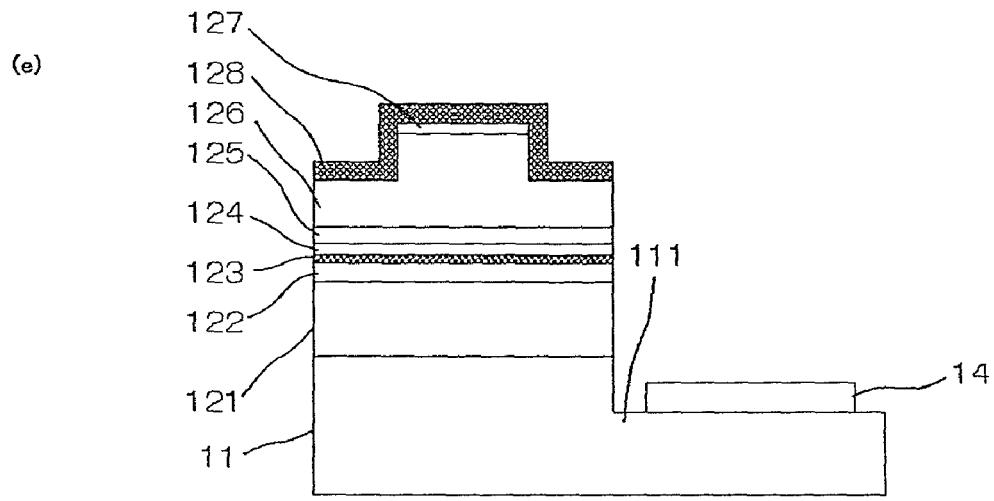
(e)
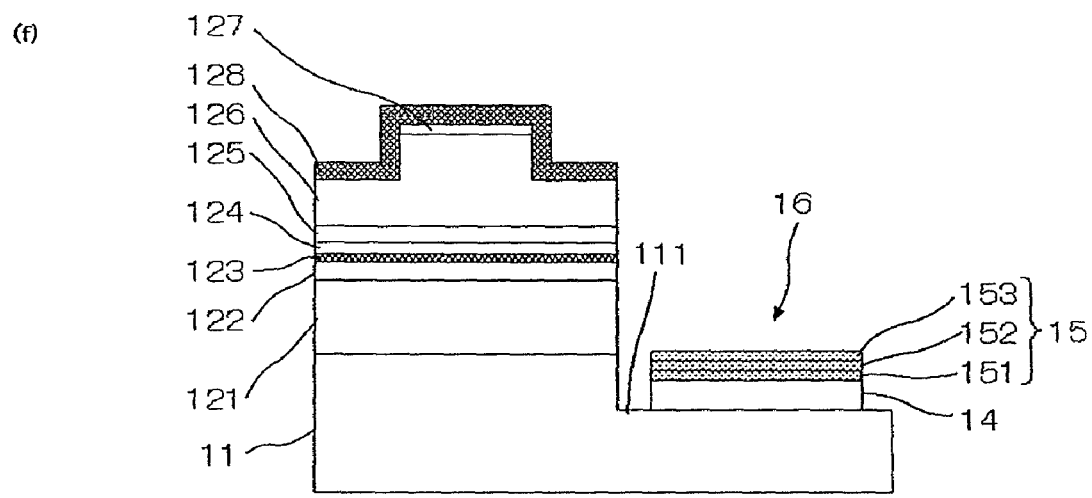
(f)

INTERFACE BETWEEN GaN
SUBSTRATE AND ELECRTRODE

ELECTRODE STRUCTURE, SEMICONDUCTOR ELEMENT, AND METHODS OF MANUFACTURING THE SAME

CROSS REFERENCE TO RELATED APPLICATIONS

This application is a divisional of U.S. patent application Ser. No. 12/519,698, filed on Jun. 17, 2009, which is a national stage of International Application No. PCT/JP2007/001381, filed on Dec. 11, 2007, which claims priority from Japanese Patent Application No. 2006-354091, filed on Dec. 28, 2006, the contents of all of which are incorporated herein by reference in their entirety.

TECHNICAL FIELD

The present invention relates to an electrode structure using a nitride semiconductor layer, a semiconductor element, and methods of fabricating the same.

BACKGROUND ART

Manufacturing of an electrode structure exhibiting an excellent ohmic contact property is understood as an important technical issue in nitride semiconductor element such as semiconductor laser, light-emitting diode and so forth.

Patent Document 1 describes a semiconductor laser configured by providing, over a nitride semiconductor layer, an n-side electrode having a stacked structure composed of a plurality of metal layers. The n-side electrode of this semiconductor laser has a layer composed of Ti formed over the nitride semiconductor layer, a topmost layer composed of Au, and a Nb-containing layer provided between the layer composed of Ti and the topmost layer, as described in claim 1 of Patent Document 1, and is annealed together with the nitride semiconductor layer at a temperature of 400° C. or higher (600° C., for example).

The n-side electrode described in Patent Document 1 is aimed at obtaining a desirable ohmic contact between the layer composed of Ti and the nitride semiconductor layer.

According to Patent Document 1, the n-side electrode and an n-type GaN layer are annealed at a temperature of 400° C. or higher (600° C., for example) so as to expel hydrogen atoms intruded in the n-type GaN layer. It is described that, by expelling hydrogen atoms, a desirable ohmic contact may be established between the layer composed of Ti of the n-side electrode and the nitride semiconductor layer.

In addition, according to Patent Document 1, degradation of the ohmic contact is prevented by using the Nb-containing layer which prevents diffusion of Au towards the nitride semiconductor layer side, in the process of annealing. More specifically, in the electrode described in Patent Document 1, the Nb-containing layer functions as a barrier layer.

[Patent Document 1] Japanese Examined Patent No. 3239350

SUMMARY

However, recent growing needs for further reduction in drive current and drive voltage of semiconductor devices have raised needs for further reduction in contact resistance between the nitride semiconductor layer and the n-side electrode. It may be difficult to realize the electrode structure capable of satisfying the needs, by the conventional technique as disclosed in Patent Document 1.

The electrode structure inevitably contains O atoms admixed therein. In the electrode disclosed in the above-described Patent Document 1, it is supposed that O atoms and Ti atoms composing the electrode combine at the interface between the nitride semiconductor layer and the electrode, to thereby form a metal oxide. Since the metal oxide is low in the electro-conductivity, so that contact resistance between the electrode and the nitride semiconductor layer is supposed to increase and to consequently inhibit reduction in the contact resistance, if the position of peak concentration in a concentration distribution of the metal oxide resides at or around the interface between the nitride semiconductor layer and the electrode.

The contact resistance may be degraded, also when Ti or the like diffused to the surface of the electrode exposes to the air and oxidizes, to thereby form a metal oxide on the surface of the electrode. The contact resistance may be degraded, still also by adhesion of pollutants to the surface of the electrode, and succeeding diffusion to the inner portion of the electrode.

An exemplary object of the invention is to provide an electrode structure reduced in the contact resistance on the surface of the electrode.

According to one exemplary aspect of the invention, there is provided an electrode structure which includes: a nitride semiconductor layer; an electrode provided over the nitride semiconductor layer; and an electrode protective film provided over the electrode, wherein the nitride semiconductor layer contains a metal nitride containing Nb, Hf or Zr as a constitutive element, the electrode has a portion having a metal oxide which contains Ti or V as a constitutive element formed therein, and the electrode protective film contains a protective layer which covers at least a portion of the electrode, and has Au or Pt as a constitutive element.

Furthermore, according to another exemplary aspect of the invention, there is provided also an electrode structure which includes: a nitride semiconductor layer; an electrode provided over the nitride semiconductor layer; and an electrode protective film provided over the electrode; wherein the nitride semiconductor layer contains a metal nitride containing Nb, Hf or Zr as a constitutive element, and contains a metal oxide, containing Ti or V as a constitutive element, distributed over a region ranging from the interface between the nitride semiconductor layer and the electrode to the inner portion of the electrode, and the position of peak concentration in a concentration distribution of the metal oxide resides on the inner side of the electrode, while being set back from a portion in the vicinity of the interface between the electrode and the nitride semiconductor layer.

The electrode structure of the exemplary aspect of the invention has the electrode protective film over the electrode, so that Ti or V, diffused to the surface of the electrode and then exposed to the air, may be prevented from being oxidized, and so that degradation in the contact resistance due to adhesion of pollutants onto the surface of the electrode may be reduced.

In the above-described electrode structure, the concentration of the metal oxide at the position of peak concentration in the concentration distribution of the metal oxide may be adjusted to 30% or lower of the total atoms at the position of peak concentration in the concentration distribution.

The total atoms at the position of peak concentration in the concentration distribution herein means the total atoms detectable by using an Auger electron spectrometer or a secondary ion mass spectrometer at the position of peak concentration.

The metal oxide contained in the electrode of the exemplary aspect of the invention is distributed over a region ranging from the interface between the nitride semiconductor layer and the electrode to the inner portion of the electrode, wherein the position of peak concentration in the concentration distribution of the metal oxide resides on the inner side, while being set back from a portion in the vicinity of the interface between the nitride semiconductor layer and the electrode (the portion means a region ranging from the interface between the electrode and the nitride semiconductor layer to as deep as 1/10 of the thickness of the electrode). As described in the above, in the exemplary aspect of the invention, the metal oxide is diffused, and consequently shows no position of peak concentration in the concentration distribution of the metal oxide at the interface between the electrode and the nitride semiconductor layer, or in the vicinity of the interface, so that the contact resistance between the electrode and the nitride semiconductor layer may be prevented from elevating due to the metal oxide. In this way, the contact resistance between the electrode and the nitride semiconductor layer may be reduced.

In addition, by adjusting the concentration of the metal oxide at the position of peak concentration to 30% or lower of the total atoms at the position of peak concentration, the contact resistance between the electrode and the nitride semiconductor layer may more exactly be reduced.

In the above-described electrode structure, a barrier layer containing any of W, Ta, Mo, Nb, Hf, V, Zr, Pt and Ti as a constitutive element may be provided between the protective layer and the electrode.

By providing the barrier layer containing any of W, Ta, Mo, Nb, Hf, V, Zr, Pt and Ti as a constitutive element between the protective layer and the electrode, any metals composing plated layer or solder layer provided on the electrode protective film may be prevented from diffusing into the inner portion of the electrode, so as to degrade the contact resistance, in the process of annealing.

The concentration of the metal oxide at the position of peak concentration may preferably be 60% or lower, more preferably be 30% or lower, still more preferably be 20% or lower, and further more preferably 10% or lower, of the total atoms at the position of peak concentration. The contact resistance between the electrode and the nitride semiconductor layer may be reduced by adjusting the concentration to 60% or lower, and may more exactly be reduced by adjusting it to 30% or lower.

In addition, the metal nitride in the nitride semiconductor layer results in formation of N vacancies, having no N atoms reside therein, in the nitride semiconductor layer, where the electron density increases. The contact resistance between the electrode and the nitride semiconductor layer may consequently be reduced, and thereby a low-resistance ohmic contact may be obtained in a reliable manner.

Now, for the purpose of exactly reducing the contact resistance between the electrode and the nitride semiconductor layer, it may be preferable that the N vacancies are formed at or around the interface between the nitride semiconductor layer and the electrode.

Accordingly, the metal nitride is preferably formed while being diffused over a region ranging from the interface between the nitride semiconductor layer and the electrode to a region in the vicinity of the interface (for example, a region ranging from the interface to as deep as 5 nm into the nitride semiconductor layer).

Further, according to another exemplary aspect of the invention, there is provided also a semiconductor element having the above-described electrode structure.

According to another exemplary aspect of the invention, there is provided still also a method of manufacturing an electrode structure which includes a nitride semiconductor layer, an electrode formed over the nitride semiconductor layer, and an electrode protective film provided over the electrode, the method includes: forming a first layer, containing Ti or V as a constitutive element, over the nitride semiconductor layer; forming a second layer, containing Nb, Hf or Zr as a constitutive element, over the first layer; annealing at least the nitride semiconductor layer, the first layer, and the second layer at 700° C. or higher and 1300° C. or lower; and forming an electrode protective film containing a protective layer which contains Au or Pt as a constitutive element, over the electrode so as to cover at least a portion of the electrode.

Further, according to another exemplary aspect of the invention, there is provided still also a method of manufacturing an electrode structure which includes a nitride semiconductor layer, an electrode formed over the nitride semiconductor layer, and an electrode protective film provided over the electrode, the method includes: forming a first layer, containing Ti or V as a constitutive element, over the nitride semiconductor layer; forming a second layer, containing Nb, Hf or Zr as a constitutive element, over the first layer; annealing at least the nitride semiconductor layer, the first layer, and the second layer at 700° C. or higher and 1300° C. or lower; and forming an electrode protective film over the electrode, the electrode protective film containing a barrier layer, which covers at least a portion of the electrode, and contains any of W, Ta, Mo, Nb, Hf, V, Zr, Pt and Ti as a constitutive element, and a protective layer formed on the barrier layer so as to cover at least a portion thereof, and contains Au or Pt as a constitutive element.

According to the exemplary aspect of the invention, since the nitride semiconductor layer, the first layer, and the second layer are annealed at 700° C. or higher and 1300° C. or lower, atoms of Ti or V (referred to as "Ti or the like", hereinafter) in the first layer combines mainly with O atoms which reside at the interface between the nitride semiconductor layer and the electrode (O atoms being bound to the surface of the nitride semiconductor layer). The metal oxide of Ti or the like, produced by combination between atoms such as Ti or the like and O atoms, diffuses from the interface between the nitride semiconductor layer and the electrode to an inner portion of the electrode, in the process of annealing. As a consequence, the metal oxide no more resides in the electrode at a high concentration in the vicinity of the interface with the nitride semiconductor layer, and thereby the contact resistance between the nitride semiconductor layer and the electrode may be reduced.

In addition, since the electrode protective film is provided over the electrode, Ti or V diffused to the surface of the electrode may be prevented from being exposed to the air and from being oxidized.

On the other hand, atoms such as Nb, Hf or Zr (referred to as "Nb or the like", hereinafter) in the second layer combine with N atoms in the nitride semiconductor layer, to thereby form the metal nitride in the nitride semiconductor layer. In this process, N vacancies, having no N atoms reside therein, are formed in the nitride semiconductor layer, where the electron density increases. The increase in the electron density lowers the contact resistance between the electrode and the nitride semiconductor layer, and thereby an ohmic contact further lowered in the contact resistance may be obtained.

As explained previously, the Nb-containing layer described in Patent Document 1 functions as a barrier layer preventing diffusion of Au, contained in the topmost layer, to the n-type GaN layer. It is therefore supposed that Nb atom per se would not intrude into the n-type GaN layer (nitride semiconductor layer), in the process of annealing.

Note that, in Patent Document 1, Ti atoms in the layer composed of Ti may intrude into the n-type GaN layer (nitride semiconductor layer), and may combine with N atoms. Ti atoms in the layer composed of Ti may, however, combine also with oxygen atoms at the interface between the n-type GaN layer and the electrode, so that Ti atoms cannot efficiently combine with N atoms. The technique of Patent Document 1, therefore, cannot form a sufficient number of N vacancies in the nitride semiconductor layer. For this reason, it may be difficult to reduce the contact resistance between the electrode and the nitride semiconductor layer.

In contrast, the exemplary aspect of the invention is configured to allow atoms of Ti or the like in the first layer to combine mainly with O atoms which reside at the interface between the nitride semiconductor layer and the electrode, and to intentionally allow atoms of Nb or the like in the second layer to diffuse into the nitride semiconductor layer. By virtue of the diffusion of atoms of Nb or the like, a sufficient number of N vacancies may be formed in the nitride semiconductor layer, and thereby the contact resistance between the electrode and the nitride semiconductor layer may be reduced.

In the process of annealing, O atoms dissociate from the surface of the nitride semiconductor layer, and thereafter N atoms in the nitride semiconductor layer dissociate. For the case of forming the electrode by providing only the second layer, without providing the first layer, Nb or the like in the second layer initially combine with O atoms, and thereby the metal oxide of Nb or the like is formed. The metal oxide of Nb or the like is produced at the interface between the electrode and the nitride semiconductor layer, but hardly migrates thereafter from the interface between the electrode and the nitride semiconductor layer even if heat is applied by annealing, due to its less diffusive feature. For this reason, due to the metal oxide of Nb or the like which resides at the interface between the electrode and the nitride semiconductor layer, atoms of Nb or the like unbound with O atoms are inhibited from diffusing towards the nitride semiconductor layer side.

Therefore, the metal nitride may be less likely to be produced based on combination of atoms of Nb or the like and N atoms in the nitride semiconductor layer, and thereby a sufficient number of N vacancies cannot be formed in the nitride semiconductor layer. As a consequence, it may become more difficult to reduce the contact resistance between the electrode and the nitride semiconductor layer to a sufficient degree.

In contrast, according to the exemplary aspect of the invention, the first layer containing Ti or the like, and the second layer containing Nb or the like are provided. In this configuration, O atoms on the surface of the nitride semiconductor layer and Ti or like in the first layer combine to produce the metal oxide of Ti or the like, wherein the metal oxide of Ti or the like diffuses from the interface to the inner portion of the electrode in the process of annealing. Diffusion of atoms of Nb or the like, towards the nitride semiconductor layer side, is not inhibited by the metal oxide of Ti or the like, so that atoms of Nb or the like can intrude to the inner portion of the nitride semiconductor layer. The metal nitride may therefore be produced based on combination of atoms of Nb or the like and N atoms in the nitride semiconductor layer, and thereby a sufficient number of N vacancies may be formed in the nitride semiconductor layer. As a consequence, the contact resistance between the electrode and the nitride semiconductor layer may be reduced to a sufficient degree.

In addition, according to the exemplary aspect of the invention, at least a part of the surface of the electrode after the annealing is covered with the electrode protective film containing the protective layer which contains Au or Pt as a constitutive element. On the surface of the electrode after being annealed, diffused Ti or the like, or Nb or the like, exposes to a part thereof, or over the entire portion thereof. By covering the element with the electrode protective film containing Au or Pt, which is less likely to be oxidized and chemically inert, degradation in the contact resistance, due to oxidation of the electrode, or due to adhesion or diffusion of pollutants onto or into the electrode, in the process of prolonged exposure to the air and succeeding processes, may be avoidable.

Moreover, according to the exemplary aspect of the invention, provision of the barrier layer containing any of W, Ta, Mo, Nb, Hf, V, Zr, Pt and Ti, which are refractory metals, as a constitutive element between the protective layer and the electrode, may also successfully prevent the contact resistance from degrading, which might otherwise be caused by diffusion of Au or Pt in the protective layer into the inner portion of the electrode or to the inner portion of the nitride semiconductor in the process of annealing after electrode protective film is formed, or caused by diffusion of metals contained in plated layer or solder layer, which contains low-melting-point metals such as Au, Sn and the like, provided over the electrode protective film, into the inner portion of the electrode in the process of annealing.

Further, according to another exemplary aspect of the invention, there is provided still also a method of manufacturing a semiconductor element which includes: forming a multi-layer film containing an active layer, over a nitride semiconductor substrate; selectively removing the multi-layer film and a surficial portion of the nitride semiconductor substrate; providing a first electrode over the surface of the nitride semiconductor substrate appeared as a result of etching, to thereby form an electrode structure; and forming a second electrode over the multi-layer film, wherein in the step of forming the electrode structure, the electrode structure is formed by the method described in any one of the individual methods described in the above.

The above and other objects, advantages and features of the present invention will be more apparent from the following description of certain preferred embodiments taken in conjunction with the accompanying drawings.

BRIEF DESCRIPTION OF THE DRAWINGS

FIGS. 3(c) and (d) are schematic drawings illustrating steps of manufacturing the semiconductor laser of the first exemplary embodiment;

FIGS. 4(e) and (f) are schematic drawings illustrating steps of manufacturing the semiconductor laser of the first exemplary embodiment;

EXEMPLARY EMBODIMENT

Figure 1:
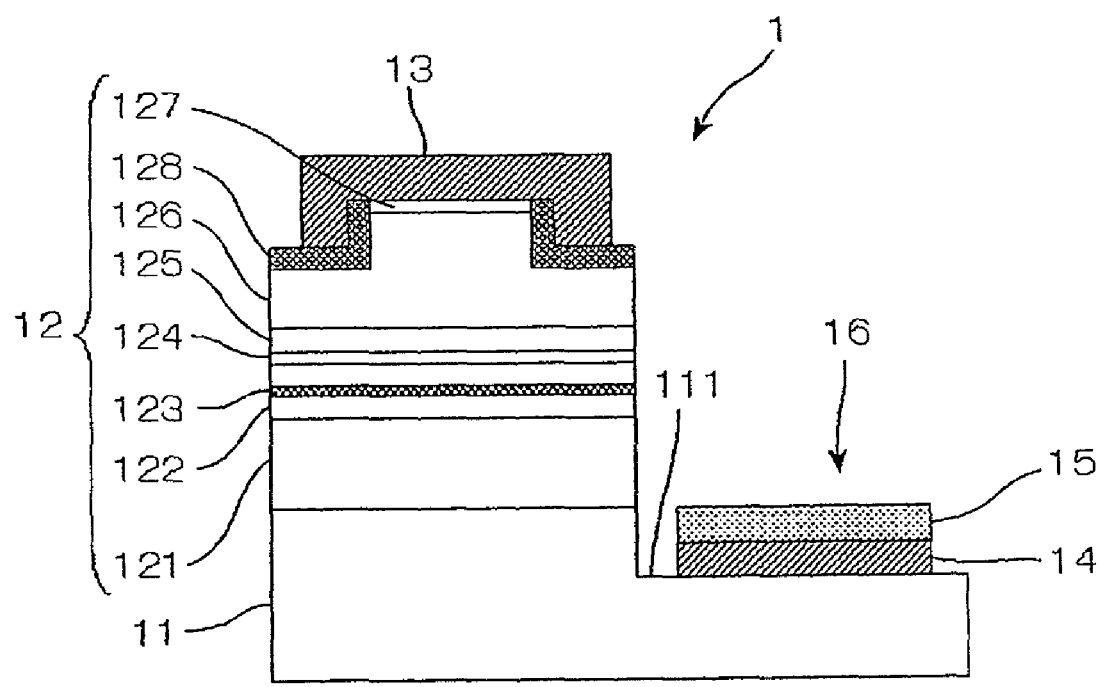
FIG. 1 is a cross sectional view illustrating a semiconductor laser according to a first exemplary embodiment.

Exemplary embodiments will be explained referring to the attached drawings. Note that, in all drawings, any similar constituents will be given with similar reference numerals, and explanations therefor will not be repeated.

(First Exemplary Embodiment)

FIG. 1 is a cross sectional view illustrating a semiconductor laser (semiconductor element) 1 according to this exemplary embodiment.

The semiconductor laser 1 has an n-type GaN substrate 11 as a nitride semiconductor layer, a multi-layer film 12 formed over the GaN substrate 11, a p-side electrode 13 (second electrode) formed over the multi-layer film 12, and a first electrode which is composed of an n-side electrode 14 formed over the GaN substrate 11 and an electrode protective film 15 formed thereon.

The GaN substrate 11 has a nearly L-shape section, as a result of removal, by dry etching, of a part of the surface of the flat substrate. The n-side electrode 14 and the electrode protective film 15 are formed on the etched surface 111 of the GaN substrate 11.

The multi-layer film 12 is formed on the (0001) surface (so-called Ga-surface) of the GaN substrate 11, and has an n-type AlGaN cladding layer 121, an n-type GaN guide layer 122, an InGaN quantum well active layer 123 causing laser light oscillation, a p-type AlGaN electron overflow blocking layer 124, a p-type GaN guide layer 125, a p-type AlGaN cladding layer 126, a p-type GaN contact layer 127, and an insulating film 128.

The AlGaN cladding layer 126 has a ridge extending in the direction of the oscillator (the direction nearly in parallel with the direction of laser light emission) formed therein.

On the top portion of the ridge, the GaN contact layer 127 is formed. The p-side electrode 13 is formed so as to be brought into contact with the surface of the GaN contact layer 127.

The insulating film 128, which is a $SiO_2$ film, is formed over the side faces of the ridge, and over the surface of the cladding layer 126 in adjacent to the ridge.

Also the n-side electrode 14 is formed over the (0001) surface of the GaN substrate 11. The n-side electrode 14, the electrode protective film 15, and the GaN substrate 11 together composes an electrode structure 16 of this exemplary embodiment.

Figure 12:
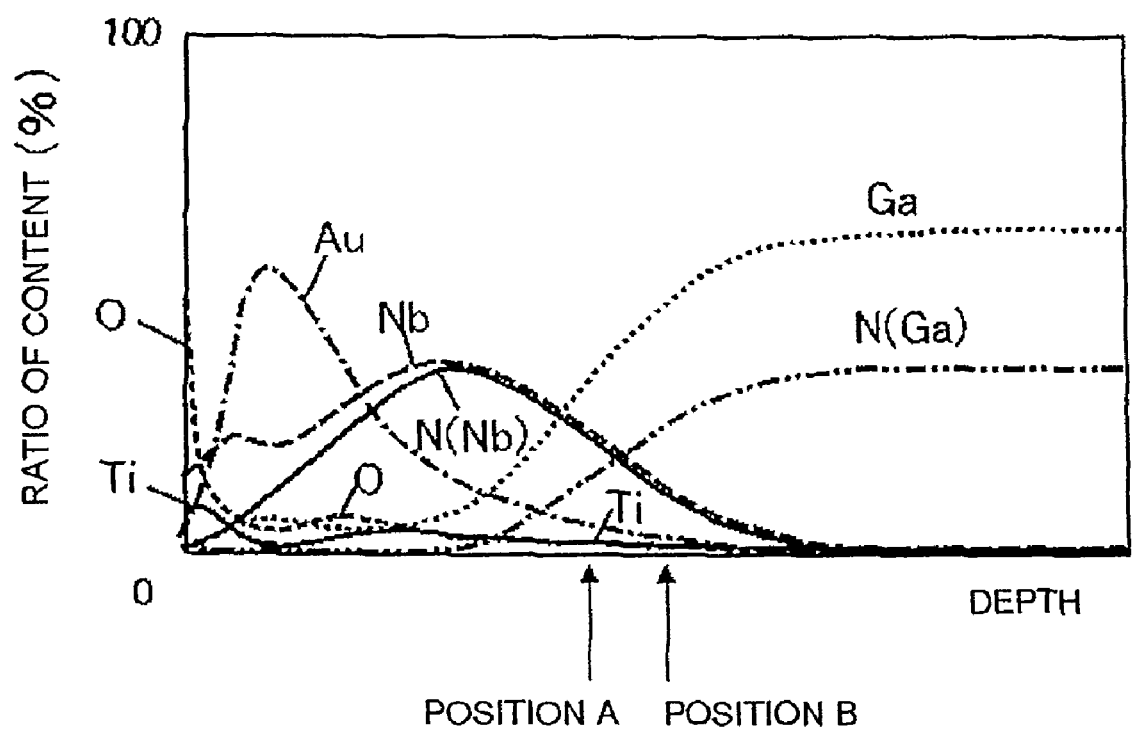
FIG. 12 is a drawing illustrating concentration distributions of atoms in the electrode structure after being annealed at 800° C.

The electrode 14 is a layer composed of a plurality of species of metals alloyed with each other. As illustrated in FIG. 12, Ti and Nb reside in the topmost portion of the electrode 14 (the top surface of the electrode 14 illustrated in FIG. 1), details of which will be explained later in Examples. The electrode 14 contains also Au, the content of which increases from the lower side (the etched surface 111 side of the GaN substrate 11) towards upper side. Also Au is contained in the topmost portion. FIG. 12 is a drawing illustrating concentration distributions of atoms in the electrode and the GaN substrate annealed at 800° C. In FIG. 12, the abscissa represents the depth in the electrode structure, showing the GaN substrate side on the right of the drawing, and the electrode side on the left of the drawing.

As exemplified in FIG. 12, the electrode 14 contains also a metal oxide which contains Ti as a constitutive element (oxide of Ti, in this exemplary embodiment).

The oxide of Ti distributes over a region ranging from the interface between the electrode 14 and the GaN substrate 11 to the topmost portion of the electrode 14. The position of peak concentration of the oxide of Ti resides at a portion inside the electrode 14, while being set back from the portion in the vicinity of the interface between the electrode 14 and the GaN substrate 11 (position "A" in FIG. 12).

The region in the vicinity of the interface herein means a region ranging from the interface between the electrode 14 and the GaN substrate 11 to as deep as 1/10 of the thickness of the electrode 14.

In addition, the peak concentration of the oxide of Ti is adjusted to 30% or lower of the total atoms at the position of peak concentration. The total atom at the position of peak concentration herein means the total atom detectable by using an Auger electron spectrometer or a secondary ion mass spectrometer at the position of peak concentration.

The peak concentration of the oxide of Ti is $1 \times 10^{22}$ cm$^{-3}$ or lower.

The electrode 14 further contains a metal nitride which contains Nb as a constitutive element (nitride of Nb, in this exemplary embodiment). The nitride of Nb distributes over a region ranging from the electrode 14 to the surface of the GaN substrate 11 (that is, the interface between the electrode 14 and the GaN substrate 11), and even across the interface with the GaN substrate 11. Accordingly, the metal nitride resides also in the GaN substrate 11, and thereby the GaN substrate 11 contains the metal nitride. As illustrated in FIG. 12, the nitride of Nb distributes from the interface between the GaN substrate 11 and the electrode 14, across a portion in the vicinity of the interface with the GaN substrate 11 (a position set back by 5 nm from the interface (position "B" in FIG. 12)) up to the inner portion of the GaN substrate 11.

Al may be included as a metal material when the electrode 14 is formed, but the drive voltage of the semiconductor laser 1 may undesirably elevate due to oxidation of Al.

For this reason, the electrode 14 may preferably be formed without mixing Al to the metal material, so as to make the electrode 14 substantially Al-free.

Substantially Al-free herein means that Al is not intentionally added to the electrode 14, while conceptually allowing inevitable inclusion of Al.

Moreover, the electrode protective film 15 is formed over the electrode 14. The electrode protective film 15 contains a barrier layer which contains any of W, Ta, Mo, Nb, Hf, V, Zr, Pt and Ti as a constitutive element, and a protective layer having Au or Pt as a constitutive element, wherein the barrier layer and the protective layer reside in this order as viewed from the electrode 14 side.

Next, a method of manufacturing the above-described semiconductor laser 1 will be explained.

Figure 2:
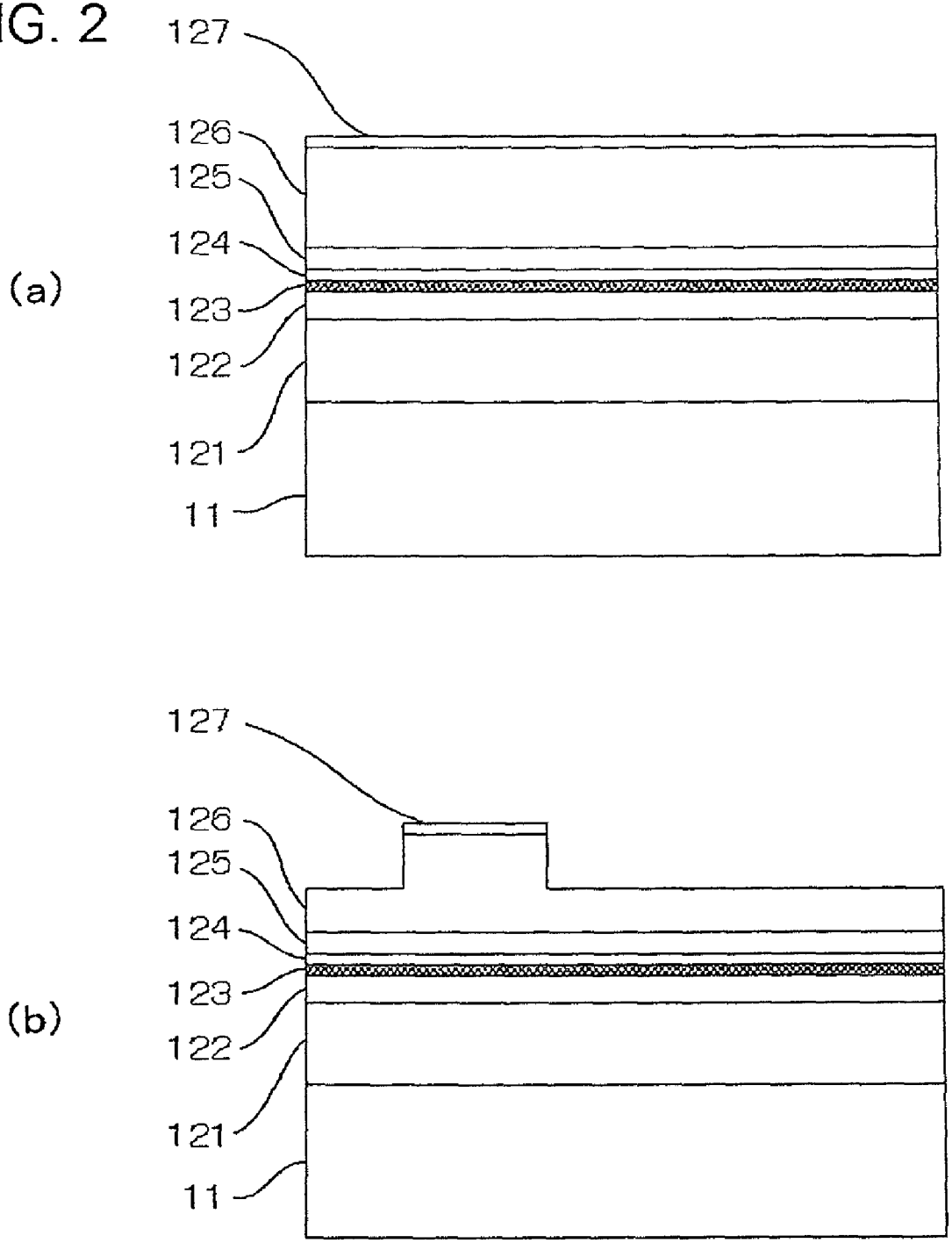
FIGS. 2(a) and (b) are schematic drawings illustrating steps of manufacturing the semiconductor laser of the first exemplary embodiment.

First, as illustrated in FIG. 2(a), the n-type AlGaN cladding layer 121, the n-type GaN guide layer 122, the InGaN quantum well active layer 123, the p-type AlGaN electron overflow blocking layer 124, the p-type GaN guide layer 125, the p-type AlGaN cladding layer 126, and the p-type GaN contact layer 127 are formed over the GaN substrate 11. The individual layers 121 to 127 may be formed typically by MOCVD (metal-organic chemical vapor deposition), although not specifically limited thereto.

Next, a mask made of a $SiO_2$ film (not illustrated) is formed over the p-type GaN contact layer 127, so as to cover a portion of the surface thereof. The mask extends in the direction of the oscillator of the semiconductor laser.

Portions of the p-type GaN contact layer 127 and the p-type AlGaN cladding layer 126 are then selectively removed by dry etching. The ridge may be formed in this way (see FIG. 2(b)). A chlorine-containing gas may be used as an etchant of the dry etching.

Next, the ridge of the AlGaN cladding layer 126 and a portion around the ridge are covered with a mask, which is the insulating film 128 made of a $SiO_2$ film, and the portion having no insulating film 128 formed thereon is then selectively removed by dry etching. The etching herein is proceeded until a part of the surface of the GaN substrate 11 is removed (FIG. 3(c)).

Next, the n-side electrode 14 is formed over the etched surface 111 of the GaN substrate 11, exposed after the dry etching.

First, as illustrated in FIG. 3(d), a first layer 141 containing Ti as a constitutive element is formed over the etched surface 111 of the GaN substrate 11. In this exemplary embodiment, the first layer 141 is not intentionally added with metal other than Ti, and is therefore given as a layer composed of Ti.

The thickness of the first layer 141 is preferably 4 nm or larger, and 15 nm or smaller.

In the process of annealing described later, O atoms which reside at the etched surface 111 of the GaN substrate 11 (the interface between the GaN substrate 11 and the electrode 14) combine with Ti atoms composing the first layer 141, to thereby form the oxide of Ti, which means that O atoms diffuse from the etched surface 111 of the GaN substrate 11. If the first layer 141 is given with a thickness of less than 4 nm, the number of Ti atoms may be extremely small relative to the number of O atoms, so that the first layer 141 may sometimes fail in allowing O atoms to diffuse from the etched surface 111 to a sufficient degree.

On the other hand, in the process of annealing described later, Nb atoms in a second layer 142 described later intrude into the GaN substrate 11, to thereby form the nitride of Nb. If the first layer 141 is given with a thickness of exceeding 15 nm, the nitride of Nb may sometimes be less likely to produce.

Next, the second layer 142 is formed over the first layer 141. The second layer 142 is a layer containing Nb as a constitutive element. In this exemplary embodiment, the second layer 142 is not intentionally added with metal other than Nb, and is therefore given as a layer composed of Nb.

Over the second layer 142, a third layer 143 composed of Au, or a Au-containing alloy (alloy of Au and Ag, for example) is further formed.

The first layer 141 to the third layer 143 may be formed by vapor evaporation.

Thereafter, the GaN substrate 11 having the electrode 14 formed thereon is annealed under a nitrogen atmosphere at 700° C. or higher and 1300° C. or lower (FIG. 4(e)).

Now, effects of the annealing will be detailed referring to a profile exemplified by FIG. 12.

Figure 5:
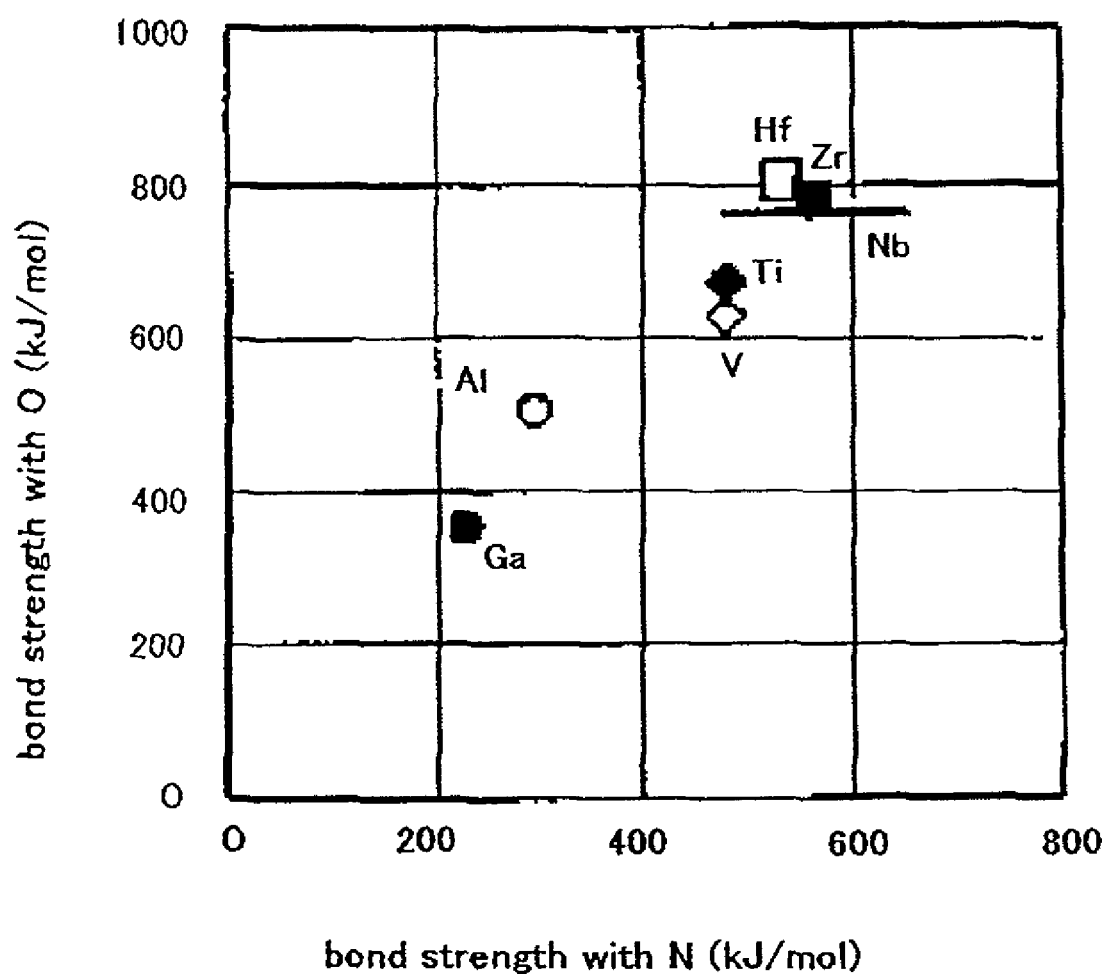
FIG. 5 is a drawing illustrating relations between bond energy to nitrogen atom and bond energy to oxygen atom.

When the GaN substrate 11 having the electrode 14 formed thereon is annealed, first O atoms are eliminated from the etched surface 111 of the GaN substrate 11, and combine with Ti atoms in the first layer 141 which resides on the GaN substrate 11. O atoms can combine with Ti atoms, because the Ti atom exhibit larger bond energy with respect to O atom, rather than Ga atom, as illustrated in FIG. 5.

The oxide of Ti based on combination of Ti atoms and O atoms is produced at the interface between the electrode 14 and the GaN substrate 11, and diffuses from the interface towards the upper portion of the electrode 14 as the annealing proceeds.

When the annealing further proceeds, Nb atoms in the second layer 142 diffuse to the inner portion of the GaN substrate 11.

Referring now to the profile illustrated in FIG. 12, it is found that Nb atoms intrude into the GaN substrate 11. It is therefore supposed that the diffusion of Nb atoms is hardly inhibited by the oxide of Ti.

N atoms are eliminated form the GaN substrate 11, and combine with Nb atoms. The metal nitride may consequently be formed at the inner portion of the GaN substrate 11. The metal nitride distributes over a region ranging from the surface of the GaN substrate 11 to the inner portion of the GaN substrate 11.

Note that N atoms eliminated from the GaN substrate 11 also diffuse towards the second layer 142 side, so that the nitride of Nb distributes also in the electrode 14.

By the combination of Nb atoms and N atoms, N vacancies are formed at the interface between the GaN substrate 11 and the electrode 14, and a portion of the GaN substrate 11 in the vicinity of the interface. By the contribution of the N vacancies, the contact resistance between the electrode 14 and the GaN substrate 11 may be reduced.

N atoms in the GaN substrate 11 herein are supposed to combine not only with Nb atoms in the second layer 142, but also with Ti atoms in the first layer 141. However, as illustrated in FIG. 5, Nb atom exhibits larger bond energy with respect to N atom rather than Ti atom, so that combination of Nb atoms and N atoms prevails. Since Nb atoms are hardly consumed for combination with O atoms which reside on the surface of the GaN substrate 11 (O atoms which reside at the interface between the GaN substrate 11 and the electrode 14), so that a lot of Nb atoms may be used for combination with N atoms.

As a consequence, a sufficient number of N vacancies may be formed in the GaN substrate 11.

Since the dissociation energy of Ti atoms in the first layer 141 and O atoms is extremely large, it is supposed that a recombination phenomenon between O atoms, eliminated from the oxide of Ti, and Nb atoms in the second layer 142 would not occur.

On the other hand, Au which resides in the topmost portion mutually diffuses with Nb and Ti, in the process of annealing. As a consequence, Ti and Nb expose to the topmost surface of the electrode 14 after the annealing.

The annealing temperature herein may preferably be 700° C. or higher and 1300° C. or lower, and particularly preferably 800° C. or higher and 1300° C. or lower. By annealing at 800° C. or higher, the combination between N atoms in the GaN substrate 11 and Nb atoms in the second layer 142 may be promoted, and thereby the contact resistance between the electrode 14 and the GaN substrate 11 may further be reduced.

The reason why the annealing temperature was specified as 1300° C. or lower is that the temperature higher than 1300° C. exceeds the melting point of the GaN substrate 11.

On the other hand, the annealing temperature lower than 700° C. may allow diffusion of Nb atoms in the second layer 142 only to an insufficient degree, and may thereby fail in forming a sufficient number of N vacancies in the GaN substrate 11.

Next, as illustrated in FIG. 4(f), the electrode protective film 15 is formed over the electrode 14 after being annealed. In this exemplary embodiment, the electrode protective film 15 is composed of a first barrier layer 151, a second barrier layer 152 and a protective layer 153, all of which are stacked in this order over the electrode 14.

The first barrier layer 151 is a layer containing any of W, Ta, Mo, Nb, Hf, V, Zr, Pt and Ti as a constitutive element. In this exemplary embodiment, the first barrier layer 151 is not intentionally added with metal other than Ti, and is therefore given as a layer composed of Ti.

The second barrier layer 152 is a layer containing any of W, Ta, Mo, Nb, Hf, V, Zr, Pt and Ti as a constitutive element. In this exemplary embodiment, the second barrier layer 152 is not intentionally added with metal other than Pt, and is therefore given as a layer composed of Pt.

The protective layer 153 is a layer containing either Au or Pt as a constitutive element. In this exemplary embodiment, the protective layer 153 is not intentionally added with metal other than Au, and is therefore given as a layer composed of Au.

The first barrier layer 151, the second barrier layer 152 and the protective layer 153 may be formed by vapor evaporation.

Next, the insulating film 128 is opened over the ridge so as to expose the p-type GaN contact layer 127, and the p-side electrode 13 is then formed on the exposed surface. Annealing is then carried out (at 400° C. for 15 minutes, for example). The back surface of the GaN substrate 11 is then polished.

The semiconductor laser 1 is completed in this way.

Effects of this exemplary embodiment will be explained below.

In this exemplary embodiment, the GaN substrate 11 having the n-side electrode 14 formed thereon is annealed at 700° C. or higher and 1300° C. or lower, so that Ti contained in the first layer 141 combines mainly with O atoms at the interface between the GaN substrate 11 and the electrode 14 (in other words, the etched surface 111 of the GaN substrate 11). The metal oxide produced based on combination between Ti and O atoms diffuses towards the upper portion of the electrode 14.

The peak concentration of the metal oxide in the concentration distribution thereof may be adjusted to 30% or lower of the total atoms at the position of peak concentration, and the position of peak concentration may fall on a portion inside the electrode 14, while being set back from the portion in the vicinity of the interface with the GaN substrate 11.

By virtue of this way of diffusion of the metal oxide, since the position of peak concentration of the metal oxide in the concentration distribution thereof no more resides in the GaN substrate 11 at or around the interface with the electrode 14, and also since the metal oxide no more resides at a high concentration in the GaN substrate 11 at or around the interface with the electrode 14, so that the contact resistance between the GaN substrate 11 and the electrode 14 may be reduced.

In particular in this exemplary embodiment, since the surface of the GaN substrate 11, on which the electrode 14 is formed, is the etched surface 111 obtained by dry etching, so that an extremely large amount of O atoms are supposed to reside thereon. For this reason, a high concentration of the metal oxide may be formed at the interface between the GaN substrate 11 and the electrode 14. However, in this exemplary embodiment, since the metal oxide is allowed to diffuse from the interface towards the inner portion of the electrode 14, so that the contact resistance between the GaN substrate 11 and the electrode 14 may effectively be reduced.

Nb contained in the second layer 142 diffuses to the interface between the GaN substrate 11 and the electrode 14, and further into the GaN substrate 11 by the annealing at 700° C. or higher and 1300° C. or lower, and combine mainly with N atoms contained in the GaN substrate 11. In this way, the metal nitride is formed in the electrode 14, and further over a region ranging from the interface between the GaN substrate 11 and the electrode 14 to the inner portion of the GaN substrate 11. As a consequence, N vacancies having no N atom are formed at the interface between the GaN substrate 11 and electrode 14, and also in the GaN substrate 11 in the portion thereof in the vicinity of the interface, and thereby electron concentration at and around the interface between the GaN substrate 11 and the electrode 14 increases. Increase in the electron concentration results in reduction in the contact resistance between the electrode 14 and the GaN substrate 11, and thereby ohmic contact showing a still lower resistance may be obtained.

Since it is supposed that the diffusion of Nb atoms is hardly inhibited by the oxide of Ti, so that the Nb atoms in this exemplary embodiment may exactly be diffused into the GaN substrate 11.

As has been described in the above, according to this exemplary embodiment, the contact resistance between the electrode 14 and the GaN substrate 11 may be reduced to a sufficient degree, because the N vacancies are formed in the GaN substrate 11, and the metal oxide at the interface between the GaN substrate 11 and the electrode 14 is allowed to diffuse.

In addition, for the case where the electrode is formed using Al as a major constituent, Al may be degraded due to generated heat if the semiconductor laser were operated over a long period at a high output. The degradation of Al may be causative of increase in the contact resistance and variation in the drive voltage of the semiconductor laser, and thereby the long-term reliability of the semiconductor laser may degrade.

In contrast, according to this exemplary embodiment, the electrode 14 is configured to be substantially Al-free, and configured by using a material (Ti, Nb, Au) less degradable by the generated heat, so that the electrode 14 may be less likely to degrade even after the semiconductor laser 1 is operated over a long period at a high output, and thereby the semiconductor laser 1 excellent in the long-term reliability may be obtained.

In this exemplary embodiment, the first layer 141 of the n-side electrode 14 is configured as a layer composed of Ti. The layer composed of Ti is excellent in adhesiveness with the GaN substrate 11, and may therefore prevent the first layer 141 from separating from the GaN substrate 11.

In this exemplary embodiment, the electrode 14 after annealing have Ti and Nb exposed onto the surface thereof. Since Ti and Nb are susceptible to oxidation, the electrode 14 may be oxidized if the surface thereof were directly exposed to the air for a long duration of time, and the contact resistance may consequently be degraded. Therefore in this exemplary embodiment, the electrode protective film 15 is formed over the electrode 14 after annealing. The electrode protective film 15 in this exemplary embodiment is composed of three layers which include the first barrier layer 151 composed of Ti, the second barrier layer 152 composed of Pt, and the protective layer 153 composed of Au. Since the protective layer 153 composing the topmost surface is made of chemically inert Au, the electrode 14 may be prevented from being oxidized.

Ti contained in the first barrier layer 151 and Pt contained in the second barrier layer 152 are refractory metals, and in particular metals having higher melting points than that of Au used for composing protective layer 153. Accordingly, the contact resistance may be prevented from degrading during the annealing in the later process, which may be caused by diffusion of Au composing the protective layer 153, into the electrode 14 in the process of annealing the p-side electrode 13, or by diffusion of low-melting-point fusing solder metal, used for bonding the semiconductor laser to a heat sink on the n-side electrode side, into the electrode 14.

In this exemplary embodiment, since Ti used for the first barrier layer 151 is excellent in adhesiveness with other materials, so that the first barrier layer 151 may be prevented from separating from the electrode 14.

In this exemplary embodiment, in the process of manufacturing the semiconductor laser 1, the individual layers 121 to 127 are formed over the GaN substrate 11, and portions of the individual layers 121 to 127, and the surficial portion of the GaN substrate 11 are removed by dry etching. Although removal of the portions of the layers 121 to 127, while avoiding removal of the GaN substrate 11, may need sophisticated control of the etching conditions, whereas there is no need of sophisticated control of the etching conditions in this exemplary embodiment, because the surficial portion of the GaN substrate 11 is to be removed.

Moreover, in this exemplary embodiment, the p-side electrode 13, the n-side electrode 14 and the electrode protective film 15 are formed over the (0001) surface of the GaN substrate 11, wherein the p-side electrode 13 is formed after the n-side electrode 14 and the electrode protective film 15 are formed. Since the temperature of annealing of the p-side electrode 13 is lower than the temperature of annealing of the n-side electrode 14, the p-side electrode 13 may be prevented from being affected by the annealing of the n-side electrode 14, by forming the p-side electrode 13 after the n-side electrode 14 is formed.

(Second Exemplary Embodiment)

Figure 6:
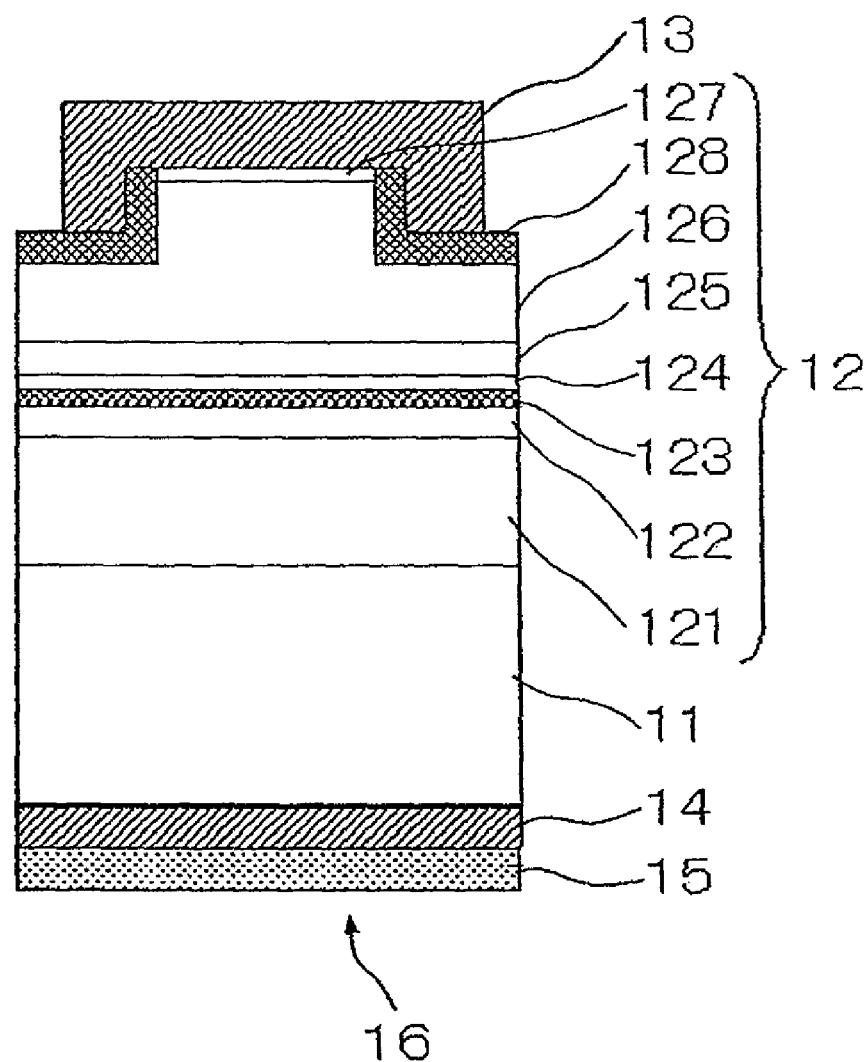
FIG. 6 is a cross sectional view illustrating a semiconductor laser according to a second exemplary embodiment.

A semiconductor laser 2 of the second exemplary embodiment will be explained, referring to FIG. 6.

Although the n-side electrode 14 and the electrode protective film 15, and the p-side electrode 13 in the above-described exemplary embodiment were formed over the (0001) surface of the GaN substrate 11, the n-side electrode 14 and the electrode protective film 15 in this exemplary embodiment are formed over the (000-1) surface (so-called N surface) of the GaN substrate 11. The other aspects are same as those described in the first exemplary embodiment.

In the process of manufacturing the semiconductor laser 2, the n-side electrode 14 and the p-side electrode 13 are necessarily annealed, similarly to as in the first exemplary embodiment.

If the temperature of annealing of the p-side electrode 13 is lower than the temperature of annealing of n-side electrode 14, the annealing of the n-side electrode 14 preferably precede the annealing of the p-side electrode 13. When the annealing of the n-side electrode 14 precedes the annealing of the p-side electrode 13, it may be recommendable to form and anneal the n-side electrode 14, to form the electrode protective film 15, to bond the GaN substrate 11 onto a support substrate, and then to form the p-side electrode 13.

Alternatively, the annealing of the p-side electrode 13 may be followed by the annealing of the n-side electrode 14.

For example, the p-side electrode 13 is formed on the top surface ((0001) surface) side of the GaN substrate 11 and such a p-side electrode 13 is annealed, and then the back surface ((000-1) surface) of the GaN substrate 11 is polished. Thereafter, the n-side electrode 14 is formed on the back surface of the GaN substrate 11, and only the back surface side of the GaN substrate 11 is selectively annealed at 700° C. or higher and 1300° C. or lower. In this case, only the back surface of the GaN substrate 11 may selectively be heated at 700° C. or higher and 1300° C. or lower, by laser annealing or flash lamp annealing. Thereafter, the electrode protective film 15 is formed over the surface of the n-side electrode 14.

According to this exemplary embodiment, a larger area may be affordable for formation of the n-side electrode 14, since the n-side electrode 14 is formed on the surface of the GaN substrate 11, opposite to the surface thereof having the p-side electrode 13 formed thereon. For example, the n-side electrode 14 may be formed over the entire portion of the back surface, so that the contact resistance may further be reduced, as compared with the case where the n-side electrode 14 is formed on the surface having the p-side electrode 13 formed thereon, such as described in the first exemplary embodiment.

Since the (000-1) surface of the GaN substrate 11 is a polished surface, it is supposed that not only O atoms, but also organic impurities reside on the (000-1) surface of the GaN substrate 11. In the process of annealing, since not only O atoms but also the organic impurities may combine with Ti which composes the electrode 14, and then may be incorporated into the electrode 14, so that the contact resistance between the electrode 14 and the GaN substrate 11 may be prevented from increasing.

The exemplary embodiments have been described in the above referring to the attached drawings, aiming at exemplifying the present invention, while allowing adoption of various configurations other than those described in the above.

For example, the first layer 141 of the electrode 14, explained as a layer composed of Ti in the aforementioned exemplary embodiments, is not limited thereto, and may be a layer composed of V. In this case, the electrode 14 after the annealing will have oxide of V formed therein.

V atom exhibits, as illustrated in FIG. 5, bond energies with respect to O atom and N atom equivalent to those exhibited by Ti atom. Accordingly, also the first layer 141 configured as a layer composed of V will form the metal oxide in the electrode 14 after being annealed, through combination with O atoms, similarly to combination with Ti atoms.

Alternatively, the first layer may be configured as a layer containing Ti and V as constitutive elements.

The first layer may be good enough to contain Ti or V as a constitutive element, and may contain other metal element(s).

However, the first layer is preferably configured as a layer composed of Ti, by virtue of its excellence in the adhesiveness with the nitride semiconductor substrate.

The second layer 142 of the electrode 14, configured as a layer composed of Nb in the aforementioned exemplary embodiments, is not limited thereto, and may be configured as a layer composed of Hf or Zr. As illustrated in FIG. 5, Hf atom and Zr atom exhibit bond energies with respect to O atom and N atom equivalent to those exhibited by Nb atom. Accordingly, also the second layer 142 configured as a layer composed of Hf or Zr will form nitride of Hf or nitride of Zr in the GaN substrate 11 and in the electrode 14 after being annealed, through combination with N atoms, similarly to combination with Nb atoms.

Since Nb is superior to Hf and Zr in thermal stability, so that the second layer 142 is preferably configured as a layer composed of Nb.

In addition, the second layer 142 may be configured as a layer composed of two or more metals selected from Nb, Hf and Zr as constitutive elements.

The second layer may be good enough to contain Nb, Hf or Zr as a constitutive element, and may contain other metal element(s).

Also by selecting arbitrarily the constitutive element of the first layer from Ti and V, and further by selecting arbitrarily the constitutive element of the second layer from Nb, Hf and Zr, effects similar to those in the aforementioned exemplary embodiments may be obtained.

The electrode 14 after being annealed, explained in the aforementioned exemplary embodiments to contain the nitride of Nb, is not limited thereto, and may have no nitride of Nb contained therein.

The electrode protective film 15, explained in the aforementioned exemplary embodiments as a film composed of three layers of the first barrier layer, the second barrier layer and the protective layer, may alternatively be configured to have only the protective layer, or to have only two layers of the barrier layer and the protective layer, or to have a plurality of barrier layers and a plurality of protective layers, or to have another electro-conductive material inserted between the barrier layer(s) and the protective layer(s).

The first barrier layer configured as a layer composed of Ti, the second barrier layer 152 configured as a layer composed of Pt, and the protective layer 153 configured as a layer composed of Au in the aforementioned exemplary embodiments are not limited thereto. The barrier layers may be configured using any element selected from W, Ta, Mo, Nb, Hf, V, Zr, Pt and Ti, or any combination of these elements, and the protective layer may be configured using either of Au and Pt, or using a mixed material of these elements.

In particular, among W, Ta, Mo, Nb, Hf, V, Zr, Pt and Ti, W has the highest melting point, so that adoption of a layer composed of W as the barrier layers, or a layer composed of a material which contains W, may result in an excellent barrier effect.

Note that the layer composed of Ti is excellent in the adhesiveness with other materials, so that any layer brought into contact with the electrode 14 is preferably configured as a layer composed of Ti.

While, in the first exemplary embodiment, the n-side electrode 14 was formed on the etched surface 111 of the GaN substrate 11, exposed after dry etching, the dry etching may be stopped halfway of the n-type AlGaN cladding layer 121 so as to allow the surface of n-type AlGaN to expose, and the n-side electrode 14 and the electrode protective film 15 may be formed over thus exposed surface.

For the case where the annealing of the n-side electrode 14 preceded the annealing of the p-side electrode 13 in the aforementioned exemplary embodiments, the electrode protective film 15 was formed over the n-side electrode 14 before the p-side electrode 13 was annealed, wherein the electrode protective film 15 may be formed after the p-side electrode 13 was annealed.

The ratio of coverage of the n-side electrode 14 by the electrode protective film 15, having not particularly been specified in the aforementioned exemplary embodiments, may be 100%, or may be larger than 0% and smaller than 100%, allowing adjustment to arbitrary values depending on a necessary level of contact resistance. Also the ratio of area of the electrode protective film 15 and the area of the n-side electrode 14 may arbitrarily be determined.

Figure 7:
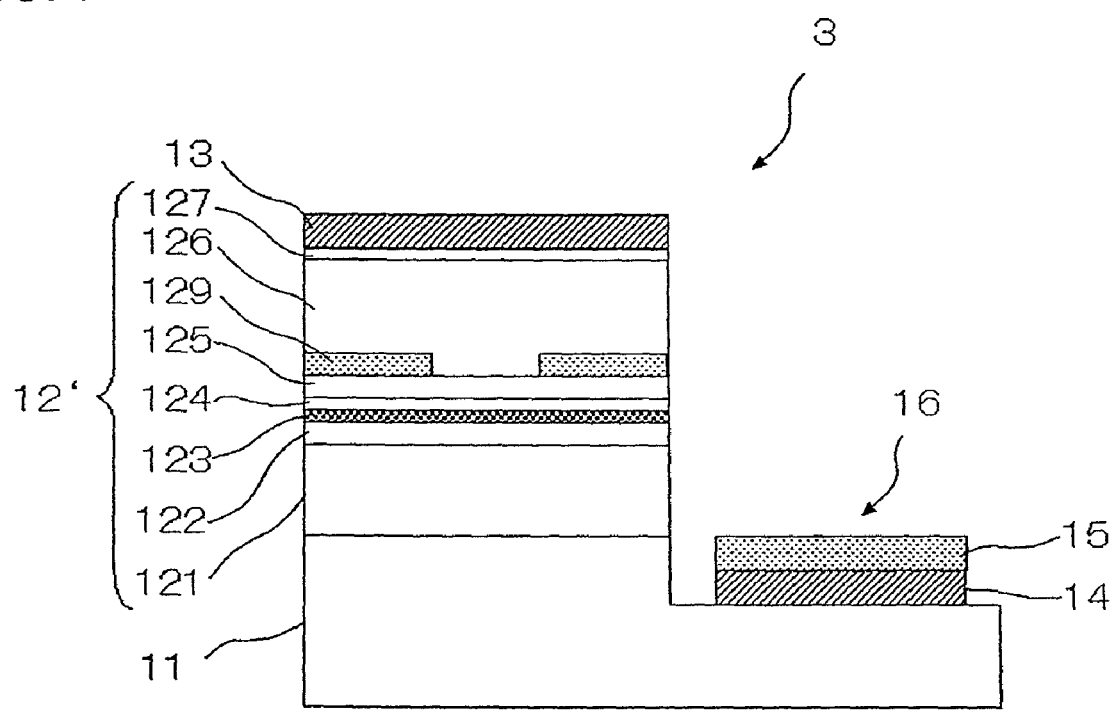
FIG. 7 is a cross sectional view illustrating a semiconductor laser according to a modified example.
Figure 8:
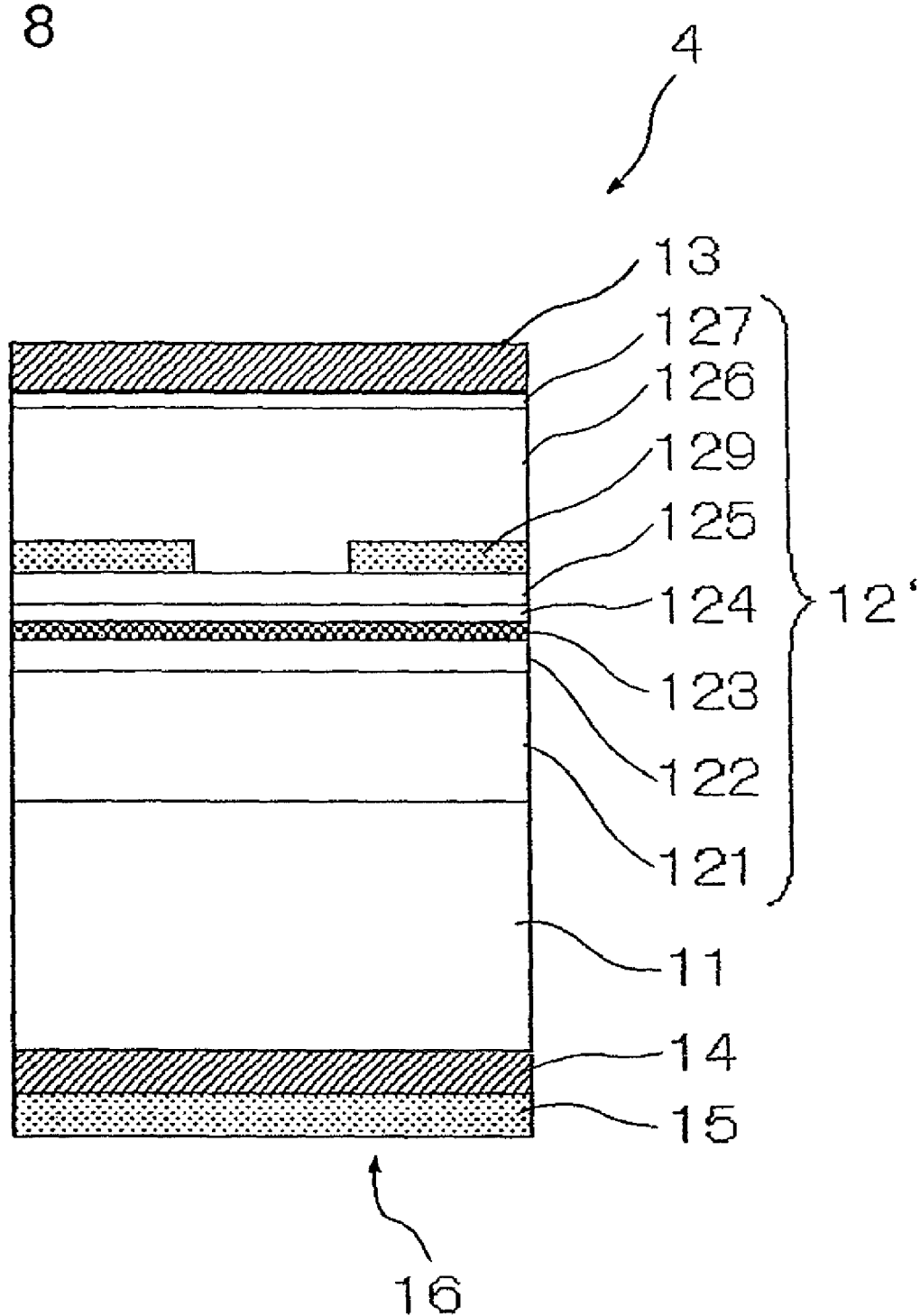
FIG. 8 is a cross sectional view illustrating a semiconductor laser according to another modified example.

The p-type AlGaN cladding layer 126, explained to have the ridge in the aforementioned exemplary embodiments, is not limited thereto, and may have no ridge formed thereto. For example, semiconductor lasers having inner-stripe structures, such as a semiconductor laser 3 illustrated in FIG. 7, and a semiconductor laser 4 illustrated in FIG. 8, may be configured.

The semiconductor lasers 3, 4 may be manufactured by stacking, on the surface of the GaN substrate 11, the n-type AlGaN cladding layer 121, the n-type GaN guide layer 122, the InGaN quantum well active layer 123, the p-type AlGaN electron overflow blocking layer 124, the p-type GaN guide layer 125, and an AlN blocking layer 129, the center portion of the AlN blocking layer 129 is then removed by etching using a mask composed of a $SiO_2$ film, to thereby form a conducting part.

Thereafter, the p-type AlGaN cladding layer 126 and the p-type GaN contact layer 127 are grown. The n-side electrode 14 and the p-side electrode 13 are then grown similarly to as described in the aforementioned exemplary embodiments.

In thus configured semiconductor lasers 3, 4, it is no more necessary to form the ridge, because the AlN blocking layer 129 exhibits current narrowing function and light confining function.

Note that the semiconductor lasers 1, 2 in the aforementioned exemplary embodiments are exemplary ones, wherein the layer structures are not limited to those described in the aforementioned exemplary embodiments.

For example, the cladding layer 126, explained as a layer composed of AlGaN in the aforementioned exemplary embodiments, is not limited thereto, and may be configured as a super-lattice cladding layer composed of AlGaN/GaN. In this way, the drive voltage of the semiconductor laser may effectively be reduced.

The nitride semiconductor substrate of the semiconductor lasers 1, 2, configured by the GaN substrate 11 in the aforementioned exemplary embodiments, is not limited thereto, and may be configured by a nitride semiconductor substrate containing In or Al as a Group III element. Alternatively, also a BN substrate or the like may be adoptable.

The electrode structure of the exemplary embodiments is not limited to those having the electrode directly formed on the substrate. For example, a GaN layer as the nitride semiconductor layer may be formed on a sapphire substrate, and the electrode may be formed on the GaN layer.

The semiconductor elements to which the electrode structure of the exemplary embodiments may be adoptable, exemplified by the semiconductor lasers 1, 2 in the aforementioned exemplary embodiments, are not limited thereto, and may be a light-emitting diode and so forth.

The semiconductor element is not limited to a light emitting element, but may be a light receiving element.

Moreover, the electrode structure of the exemplary embodiments may be adoptable to electronic devices such as field effect transistor (FET). When the electrode structure of the exemplary embodiments is adopted to field effect transistor (FET) and so forth, the electrode may be formed on the surface of an AlGaN (compositional ratio of Al of 0.2 to 0.4 or around) substrate or an AlGaN (compositional ratio of Al of 0.2 to 0.4 or around) layer.

EXAMPLES

Example 1

A semiconductor laser similar to that described in the first exemplary embodiment was manufactured, and relation between the temperature of annealing of the electrode structure and voltage was examined.

More specifically, the multi-layer film similar to that described in the first exemplary embodiment was formed over the GaN substrate, and the n-side electrode was formed. The first layer of the n-side electrode was configured by a layer composed of Ti, the second layer was configured by a layer composed of Nb, and the third layer was configured by a layer composed of Au, wherein the thickness of the second layer was set to 50 nm, and the thickness of the third layer was set to 100 nm. The thickness of the first layer was varied over the range from 5 to 100 nm, so as to form 6 types of n-side electrodes.

The GaN substrate having the n-side electrode formed thereon was annealed at different temperatures, to form the p-side electrode.

Voltage between the n-side electrodes and the p-side electrodes, obtained at different temperatures of annealing, was measured. The annealing was carried out under a nitrogen atmosphere.

In the examination, the electrode protective film was not formed over the n-side electrode. The relation between the temperature of annealing and voltage could be investigated, since the contact resistance of the n-side electrode after being annealed does not vary in a short period even under the absence of the electrode protective film.

Figure 9:
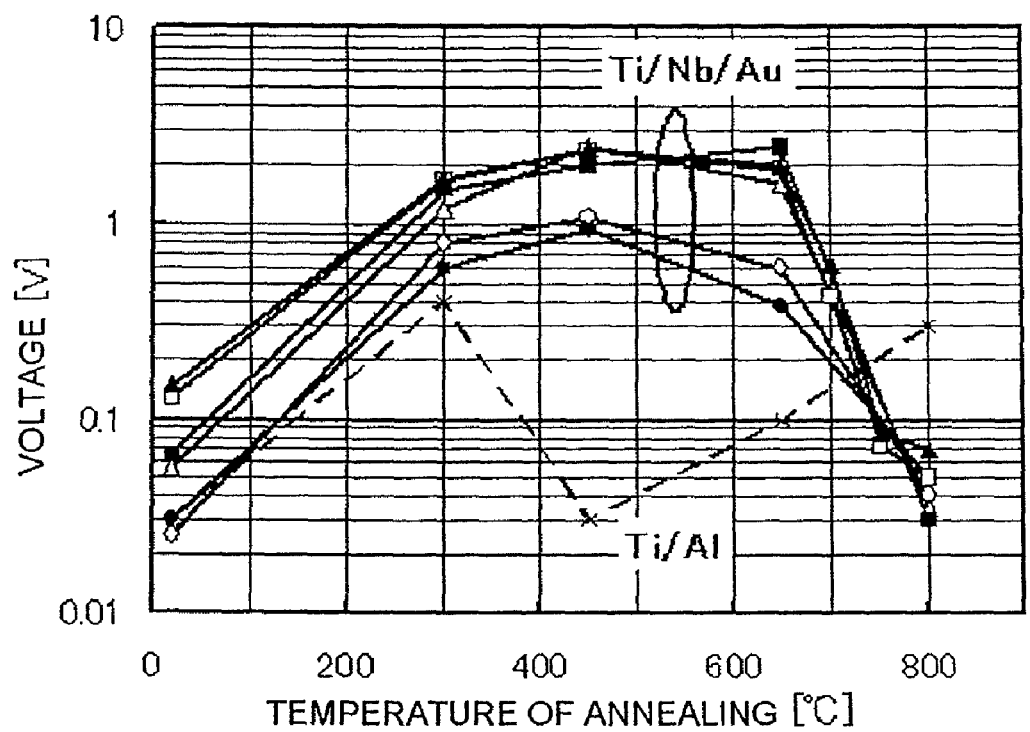
FIG. 9 is a drawing illustrating relations between annealing temperature and voltage between the n-side electrode and the p-side electrode.

Results are shown in FIG. 9.

In FIG. 9, filled triangle plots represent the first layer of 100 nm thick, open square plots represent the first layer of 5 nm thick, filled square plots represent the first layer of 50 nm thick, open triangle plots represent the first layer of 30 nm thick, filled circle plots represent the first layer of 10 nm thick, and open circle plots represent the first layer of 15 nm thick.

It is known from FIG. 9 that the voltage sharply increased up to the temperature of annealing of 300° C. It is also known that the voltage gradually increased over the range of temperature of annealing from 300° C. to 650° C. In addition, the voltage was found to decrease in the range of temperature of annealing beyond 700° C.

In Example of above-described Patent Document 1, the electrode structure was annealed at 600° C. Referring now to FIG. 9, the electrode structure of the exemplary embodiments annealed at 700° C. or above was found to be lower than that attained by the electrode structure disclosed in the conventional Patent Document 1.

Note that, in view of obtaining the contact resistance sufficiently low on the practical basis, the voltage value shown in FIG. 9 may preferably be 0.1 V or smaller. Accordingly, the temperature of annealing may preferably be adjusted to 750° C. or higher.

Next, relation between the temperature of annealing of the electrode structure containing the n-side electrode and the GaN substrate, and concentration distributions of atoms composing the electrode structure were examined.

First, over the GaN substrate, a first layer (a layer composed of Ti, 5 nm thick), a second layer (a layer composed of Nb, 50 nm thick), and a third layer (a layer composed of Au, 100 nm thick) were provided, to form each electrode structure. Three electrode structures, which include an electrode structure not annealed, an electrode structure annealed at 400° C., and an electrode structure annealed at 800° C., were evaluated based on Auger electron spectra, so as to confirm the concentration distributions of the atoms composing the electrode structures. Results are shown in FIG. 10 to FIG. 12.

Figure 10:
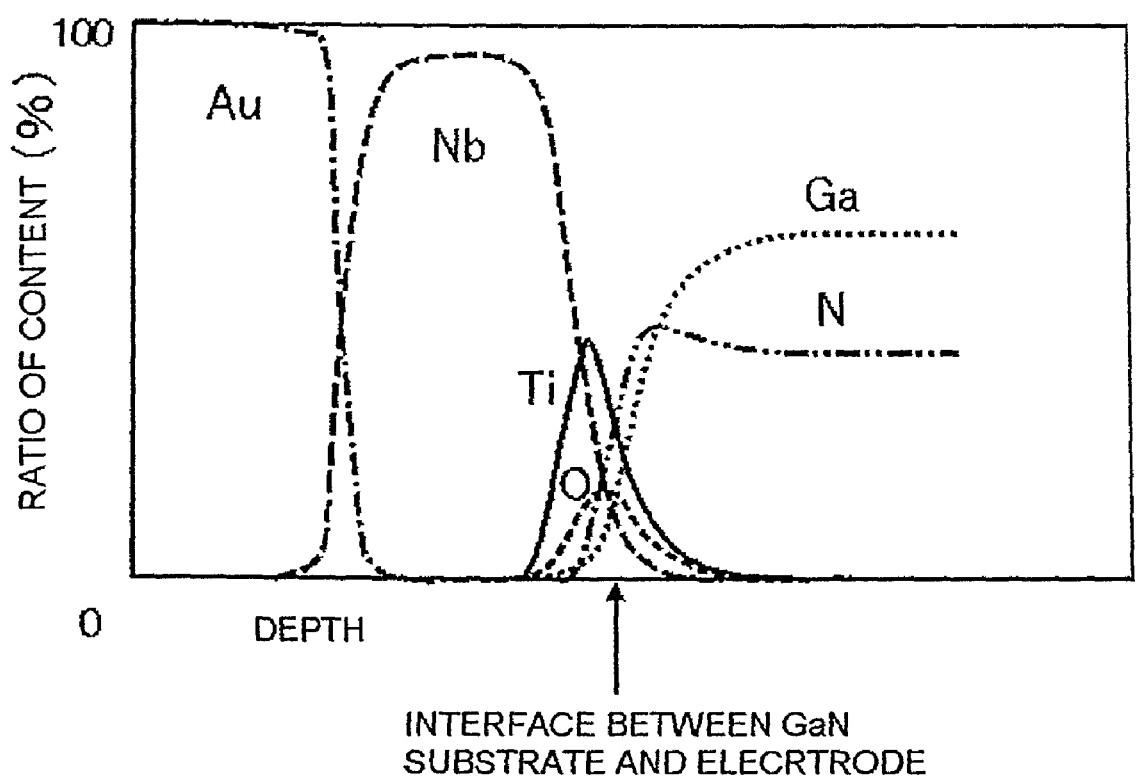
FIG. 10 is a drawing illustrating concentration distributions of atoms in the electrode structure before being annealed.
Figure 11:
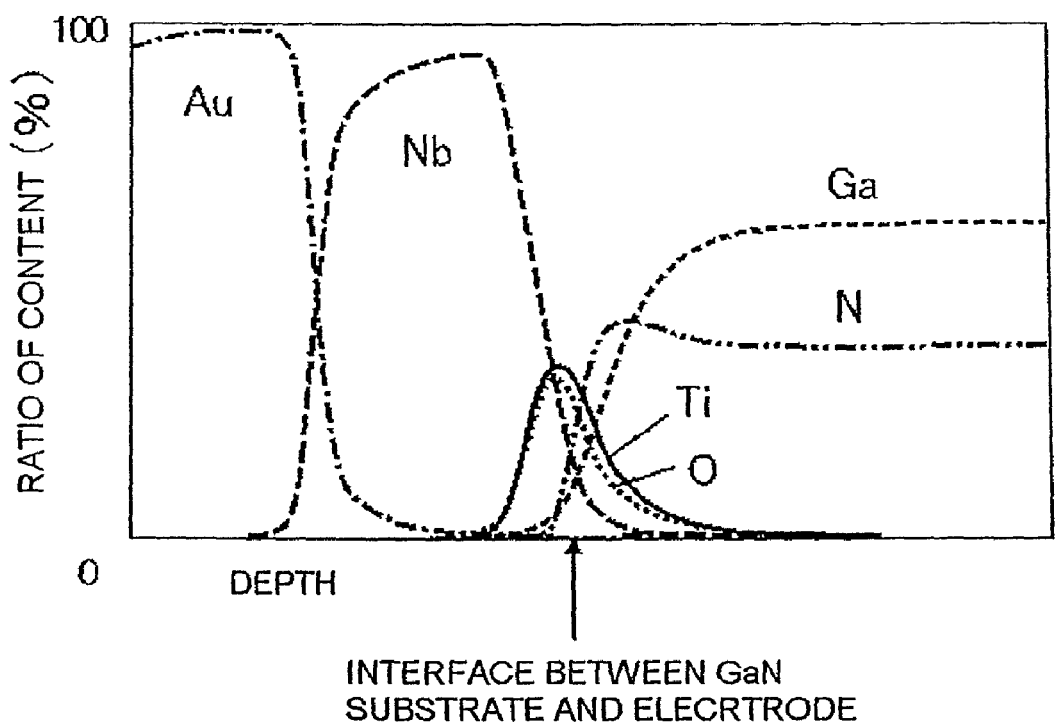
FIG. 11 is a drawing illustrating concentration distributions of atoms in the electrode structure after being annealed at 400° C.

In each of FIG. 10 to FIG. 12, the abscissa represents the depth in the electrode structure, wherein the right side of the drawing corresponds to the GaN substrate side, and the left side of the drawing corresponds to the electrode side.

FIG. 10 illustrates concentration distributions of the atoms in the electrode structure before being annealed.

It is confirmed that, in the electrode structure before being annealed, the first layer composed of Ti, the second layer composed of Nb, and the third layer composed of Au are stacked on the GaN substrate. It is also found that that high concentration of O resides at the interface between the GaN substrate and the electrode.

FIG. 11 illustrates concentration distributions of the atoms in the electrode structure after annealed at 400° C. It is confirmed that O atoms at the interface between the GaN substrate and the electrode combine with Ti atoms composing the first layer, to thereby form the metal oxide. The metal oxide resides in the vicinity of the interface between the GaN substrate and the electrode in an concentrated manner. The position of peak concentration of the metal oxide resides in the vicinity of the interface, wherein the peak concentration of the metal oxide exceeds 30% of the total atoms at the position of peak concentration.

The reason why the voltage sharply increased at around 300° C. as illustrated in FIG. 9 may be supposedly because O atoms on the surface of the GaN substrate combined with Ti atoms composing the first layer, so that a high concentration of metal oxide, which is low in the electro-conductivity, was formed at around the interface between the GaN substrate and the electrode.

FIG. 12 illustrates concentration distributions of the atoms in the electrode structure after annealed at 800° C. It is confirmed that, in the electrode structure annealed at 800° C., Nb atoms composing the second layer diffuses to the interface between the GaN substrate and the electrode, and further into the GaN substrate, and forms nitride of Nb.

FIG. 12 separately indicate N combined with Ga and N combined with Nb, which are denoted as N(Ga) and N(Nb), respectively. The N(Ga) profile lies along the Ga profile, and the N(Nb) profile approximately coincides with the Nb profile on the interface side.

Figure 13:
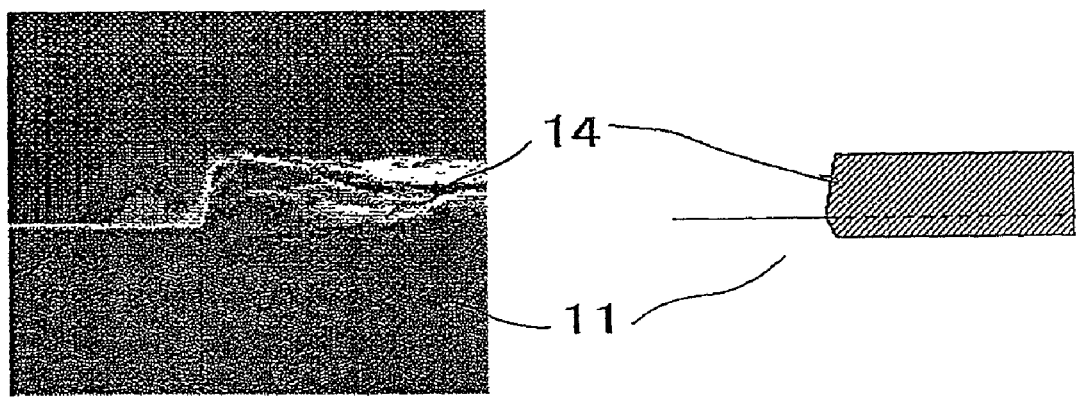
FIG. 13 is a drawing illustrating a section of the electrode structure annealed at 800° C., observed under an electron microscope.

FIG. 13 illustrates a section of an electrode structure annealed at 800° C., observed under an electron microscope. Also from this result of observation, it was confirmed that, by the annealing at 800° C., Nb atom intruded inside the GaN substrate, and thereby the nitride of Nb was formed over a region ranging from the surface of the GaN substrate to the inner portion of the GaN substrate.

In an schematic drawing on the right of FIG. 13, the hatched portion in the GaN substrate 11 represents the nitride of Nb.

Referring now back to FIG. 12, it is found that O atoms previously resided on the surface of the GaN substrate combined mainly with Ti atoms to form the oxide of Ti. The oxide of Ti is found to reside over a region ranging from the interface between the electrode and the GaN substrate to the inner portion of the electrode. The peak concentration in the concentration distribution of the oxide of Ti was found to be 30% or lower (10% or lower in FIG. 12) of the total atoms at the position of peak concentration. The position of peak concentration in the distribution of the oxide of Ti was found at a position more closer to the electrode as viewed from a portion in the vicinity of the interface between the electrode and the GaN substrate.

The peak concentration of the oxide of Ti was found to be $1 \times 10^{22}$ cm$^{-3}$ or lower.

As has been described in the above, the voltage largely decreased as illustrated in FIG. 9, supposedly because the Nb atoms intruded into the GaN substrate by the annealing at 800° C., thereby N vacancies were formed in the GaN substrate, and the metal oxide resided at the interface between the GaN substrate and the electrode diffused.

The effect of reducing resistivity by the annealing was confirmed when the peak concentration of the oxide of Ti after annealing was 30% or lower of the total atoms at the position of peak concentration, the reduction in voltage became more distinct at 20% or lower (voltage between the n-side electrode and the p-side electrode was 0.2 V or lower), and a practically sufficient level of low-voltage-operation was realized with a good reproducibility at 10% or lower as illustrated in FIG. 12, showing voltage between the n-side electrode and the p-side electrode was 0.1 V or lower.

Next, relations between the annealing and the contact resistance in the electrode structure, having the electrode formed without providing the first layer, were examined.

More specifically, on the GaN substrate having a multi-layer film similar to that in the first exemplary embodiment formed thereon, a second layer (50 nm) composed of Nb, and a third layer (100 nm) composed of Au were provided, without providing a first layer. The multi-layer film, the GaN substrate, the second layer and the third layer were then annealed at 800° C. under a nitrogen atmosphere, and a p-side electrode was formed to obtain a semiconductor laser.

Voltage between the n-side electrode and the p-side electrode of the semiconductor laser was measured. The voltage was found to be extremely high, despite the annealing at 800° C.

It was confirmed, from evaluation of Auger electron spectra of the n-side electrode and the GaN substrate of this semiconductor laser, that the oxide of Nb resided at the interface between the electrode and the GaN substrate. Nb was found to scarcely diffuse into the GaN substrate, so that nitride of Nb was not confirmed there.

As has been described in the above, it is supposed for the case where the second layer was formed on the GaN substrate without forming the first layer on the GaN substrate, that the oxide of Nb resides at the interface between the electrode and the GaN substrate, to thereby inhibit Nb atoms from diffusing into the GaN substrate. It is, therefore, supposed that a sufficient number of N vacancies cannot be formed in the GaN substrate, and thereby the contact resistance between the electrode and the GaN substrate cannot be reduced.

In contrast, it is supposed for the case where the first layer composed of Ti, the second layer composed of Nb, and the third layer composed of Au were formed on the GaN substrate as illustrated in FIG. 12, that Nb atoms are not inhibited, by the oxide of Ti, from diffusing into the GaN substrate side, and that the nitride of Nb is formed in the GaN substrate. It is, therefore, supposed that the N vacancies may be formed in the GaN substrate, and thereby the contact resistance between the electrode and the GaN substrate may be reduced.

The invention claimed is:

1. A method of manufacturing an electrode structure comprising a nitride semiconductor layer, an electrode formed over said nitride semiconductor layer, and an electrode protective film provided over said electrode, the method comprising:

forming a first layer, containing Ti or V as a constitutive element, over said nitride semiconductor layer;

forming a second layer, containing Nb, Hf or Zr as a constitutive element, over said first layer;

annealing at least said nitride semiconductor layer, said first layer, and said second layer at 700° C. or higher and 1300° C. or lower; and forming an electrode protective film, containing a protective layer which contains Au or Pt as a constitutive element, over said electrode so as to cover at least a portion of said electrode.

2. A method of manufacturing an electrode structure comprising a nitride semiconductor layer, an electrode formed over said nitride semiconductor layer, and an electrode protective film provided over said electrode, the method comprising:

forming a first layer, containing Ti or V as a constitutive element, over said nitride semiconductor layer;

forming a second layer, containing Nb, Hf or Zr as a constitutive element, over said first layer;

annealing at least said nitride semiconductor layer, said first layer, and said second layer at 700° C. or higher and 1300° C. or lower; and forming an electrode protective film over said electrode, said electrode protective film containing a barrier layer, which covers at least a portion of said electrode, and contains any of W, Ta, Mo, Nb, Hf, V, Zr, Pt and Ti as a constitutive element, and a protective layer formed on said barrier layer so as to cover at least a portion thereof, and contains Au or Pt as a constitutive element.

3. A method of manufacturing the electrode structure described in claim 1, wherein in said annealing, Ti or V contained in said first layer and oxygen atom contained in the interface between said nitride semiconductor layer and said electrode are allowed to combine to form a metal oxide, said metal oxide is allowed to diffuse into the inner portion of said electrode, and Nb, Hf or Zr as a constitutive element of said second layer is allowed to diffuse into the inner portion of said nitride semiconductor layer to form a metal nitride.

4. The method of manufacturing the electrode structure described in claim 1, wherein said barrier layer contains any of Nb, Pt and Ti.

5. A method of manufacturing a semiconductor element comprising:

forming a multi-layer film containing an active layer, over a nitride semiconductor substrate;

selectively removing said multi-layer film and a surficial portion of said nitride semiconductor substrate;

providing a first electrode over the surface of said nitride semiconductor substrate appeared as a result of etching, to thereby form an electrode structure; and forming a second electrode over said multi-layer film, wherein in said forming said electrode structure, said electrode structure is formed by the method described in claim 1.

* * * * *